(12) United States Patent
Saito

(10) Patent No.: US 7,577,287 B2
(45) Date of Patent: Aug. 18, 2009

(54) EARLY ERROR DETECTION DURING FABRICATION OF RETICLES

(75) Inventor: Yasuko Saito, Minato-ku (JP)

(73) Assignee: NEC Corporation, Tokyo (JP)

( * ) Notice: Subject to any disclaimer, the term of this patent is extended or adjusted under 35 U.S.C. 154(b) by 650 days.

(21) Appl. No.: 11/205,095

(22) Filed: Aug. 17, 2005

(65) Prior Publication Data

US 2006/0039594 A1 Feb. 23, 2006

(30) Foreign Application Priority Data

Aug. 18, 2004 (JP) ............................. 2004-237820

(51) Int. Cl.
*G06K 9/00* (2006.01)
(52) U.S. Cl. ..................................................... 382/145
(58) Field of Classification Search ...................... None
See application file for complete search history.

(56) References Cited

U.S. PATENT DOCUMENTS

| | | | | |
|---|---|---|---|---|
| 6,704,695 | B1 * | 3/2004 | Bula et al. ...................... | 703/6 |
| 6,760,892 | B2 * | 7/2004 | Taoka et al. ..................... | 716/4 |
| 6,907,587 | B2 * | 6/2005 | Rittman et al. ................. | 716/5 |
| 2004/0044981 | A1 * | 3/2004 | Yoshimura et al. ............ | 716/19 |

FOREIGN PATENT DOCUMENTS

| | | | |
|---|---|---|---|
| JP | 11-329929 | A | 11/1999 |
| JP | 2000-250960 | A | 9/2000 |
| JP | 2003-303213 | A | 10/2003 |
| JP | 2004-094044 | A | 3/2004 |

\* cited by examiner

*Primary Examiner*—Brian P Werner
*Assistant Examiner*—Elisa M Rice
(74) *Attorney, Agent, or Firm*—Sughrue Mion, PLLC

(57) ABSTRACT

The reticle fabrication system of the present invention includes a first preparatory processor, a second preparatory processor, a comparison/determination unit, a first converter, and a second converter. The first preparatory processor performs preparatory processing for converting CAD data to plotting data, and the second preparatory processor carries out preparatory processing for converting the CAD data to inspection data. The comparison/determination unit compares the content of the preparatory processing of the first preparatory processor and the content of the preparatory processing of the second preparatory processor, and upon determining, based on the results of comparison, that the preparatory processing has been carried out correctly, permits the actual conversion of the CAD data. When the conversion of CAD data has been permitted, the first converter converts the CAD data to plotting data, and the second converter converts the CAD data to inspection data.

13 Claims, 5 Drawing Sheets

EARLY ERROR DETECTION DURING FABRICATION OF RETICLES

BACKGROUND OF THE INVENTION

1. Field of the Invention

The present invention relates to a reticle fabrication system and reticle fabrication method for fabricating a mask (reticle) for a photolithographic process used in fabricating a semiconductor integrated circuit.

2. Description of the Related Art

Photolithographic processes are indispensable as the fabrication process of semiconductor integrated circuits. A photolithographic process typically employs a mask called a reticle on which the desired circuit pattern of a semiconductor integrated circuit is written with a lightproof material such as chromium. In current photolithographic technology, a typical method involves applying photoresist to a semiconductor substrate through which light penetrates such as a quartz glass substrate, and then exposing this substrate with a ¼ to ⅕ reduction to transfer the circuit pattern that has been inscribed on the reticle to the substrate.

A reticle fabrication method of the prior art for fabricating the above-mentioned typical reticle will be described with reference to FIG. 1.

Referring to FIG. 1, CAD data 101, which is a semiconductor integrated circuit design plan, are converted to electron beam (EB) plotting data 103 in first data converter 102. These EB plotting data 103 are supplied as input to EB plotting device 104. EB plotting device 104, based on these EB plotting data 103 that have been supplied as input, plots a figure pattern such as a circuit pattern on preplot reticle 105 to fabricate plotted reticle 106.

Plotted reticle 106 is developed by developer 107 to produce developed reticle 108. Developed reticle 108 is inspected in reticle inspection device 111 to determine whether the figure patterns that have been formed correctly reflect CAD data 101.

CAD data 101 are also converted to inspection data 110 in second data converter 109. Inspection data 110 are supplied as input to reticle inspection device 111, and in reticle inspection device 111, these inspection data 110 are used for confirming the absence of errors in the figure patterns that have been plotted on developed reticle 108. When it has been verified, as a result of this inspection, that the figure patterns have been formed correctly on developed reticle 108, this developed reticle 108 is determined as a quality product and becomes inspected reticle 112.

With the reticle fabrication method described above, if a defect (an error) is detected in developed reticle 108 during the inspection process in reticle inspection device 111, it was extremely difficult to determine whether this error was due to a conversion error in first data converter 102 or second data converter 109 or to a fabrication error in the plotting process or developing process.

Furthermore, with the reticle fabrication method described above, if a conversion error has occurred by first data converter 102 or second data converter 109, the reticle still proceeds through the plotting process and developing process for fabrication, Thus, the reticle will only finally determined to be defective only after detection as an error in the inspection process.

Like reticle inspection device 111, EB plotting device 104 is a device that is expensive, and great importance is placed on improving the effective serviceability ratio. However, operating EB plotting device 104 that plots reticles that are defective, due to EB plotting data 103 that contain data conversion errors, results in a remarkable increase in the fabrication costs. There is the additional problem that reticles that have been fabricated by EB plotting data 103 that contain errors are useless.

To address this problem, Document JP-A-2004-094044 (hereinafter referred to as Document 1) discloses a technique for comparing EB plotting data and inspection data in a data inspection device after data conversion to inspect for the presence or absence of data conversion errors. For data alone that have been determined to be correct as a result of this inspection, the reticles are fabricated through processings by the EB plotting device and developer.

The reticle fabrication method described in the Document 1 will be described with reference to FIG. 2. In FIG. 2, parts that are identical to parts in FIG. 1 are given the same reference numerals, and detailed explanation thereof is here omitted.

Referring to FIG. 2, with the reticle fabrication method described in Document 1, EB plotting data 103 and inspection data 110 are supplied as input to data inspection device 113. Data inspection device 113 compares information relating to figure patterns that is contained in EB plotting data 103 and inspection data 110 that have been supplied as input, to determine whether data conversion has been carried out correctly in first data converter 102 and second data converter 109.

If it is determined in data inspection device 113 that EB plotting data 103 are data in which CAD data 101 have been correctly converted, EB plotting device 104 is permitted to conversely fabricate plotted reticle 106. On the other hand, if it is determined that errors have occurred in the data conversion, the fabrication of plotted reticle 106 in EB plotting device 104 is not performed.

The reticle fabrication method described in Document 1 has the advantage of enabling the detection of data errors before the plotting process in EB plotting device 104 and the inspection process in reticle inspection device 111. However, there is the problems that because the conversion processes in first and second data converters 102 and 109 must still be completed, and these conversion processes are time-consuming, the detection of errors renders the conversion processes themselves useless, resulting in a major loss of useless time.

SUMMARY OF THE INVENTION

It is an object of the present invention to provide a reticle fabrication system and a reticle fabrication method that is capable of detecting errors in data before the plotting process or inspection process, and also capable of detecting errors in a short period of time before the completion of the data conversion operation, whereby the amount of time that is wasted when an error occurs can be greatly reduced and the fabrication of defective reticles that contain errors can be prevented in advance.

The applicant, as a result of diligent research, have found that the forementioned problem can be solved by determining whether or not errors have occurred in a preparatory stage before converting CAD data to plotting data and inspection data.

More specifically, the reticle fabrication system according to the present invention comprises: a first preparatory processing means, a second preparatory processing means, a first preparatory process recording means, a second preparatory process recording means, a comparison/determination means, a first conversion means, a second conversion means, and an inspection means.

The first preparatory processing means performs preparatory processing for converting CAD data, which are reticle design data, to plotting data, and the second preparatory processing means performs preparatory processing for converting CAD data to inspection data. The first preparatory process recording means records a log file indicative of the content of the preparatory processing of the first preparatory processing means as a first processing log; and the second preparatory process recording means records a log file indicative of the content of the preparatory processing of the second preparatory processing means as a second processing log. The comparison/determination means compares the first processing log with the second processing log, and permits the conversion of the CAD data upon determining, based on the results of this comparison, that preparatory processing has been carried out correctly. When conversion of the CAD data has been permitted, the first conversion means converts the CAD data to plotting data, and the second conversion means converts the CAD data to inspection data. The inspection means uses the inspection data to inspect the reticle that is produced from the plotting data.

The above-mentioned configuration enables the detection of errors at the stage of preparatory processing before the actual conversion of the CAD data. As a result, when an error occurs, by halting the data conversion process, plotting process, and inspection process, that take up the large amount of time in the fabrication process of reticles, the amount of wasted time can be greatly reduced and the fabrication of defective reticles that contain errors can be prevented. Further, when reconsidering the fabrication process after the occurrence of an error, the above-mentioned configuration can minimize the number of steps and the amount of time that are necessary in the feedback process.

In addition, the first processing log and the second processing log may be produced as log files in text format.

The above-mentioned configuration can reduce the volume of data that are the object of comparison by the comparison/determination means, thereby shorting the time that is required for comparison and determination. In addition, the automation of comparison and determination in the comparison/determination means can prevent verification errors that occur during preparatory processing that precedes data conversion that conventionally was carried out manually by an operator without generating new operation process.

The first preparatory processing means, the second preparatory processing means, the first preparatory process recording means, the second preparatory process recording means, the comparison/determination means, the first conversion means, and the second conversion means may be provided within a common data converter.

The above-mentioned configuration enables determination of whether or not the preparatory processing has been carried out correctly in the common data converter and thus enables a more compact system.

The comparison/determination means may also be provided with functions to transmit the comparison results to the first preparatory processing means and/or the second preparatory processing means and to prompt a reconsideration of the preparatory processing when it has been determined that the preparatory processing has not been carried out correctly.

The above and other objects, features, and advantages of the present invention will become apparent from the following description with reference to the accompanying drawings, which illustrate examples of the present invention.

DESCRIPTION OF THE PREFERRED EMBODIMENT

First Embodiment

The configuration of the reticle fabrication system according to the first embodiment of the present invention will be described the with reference to FIG. 3.

Figure 1:
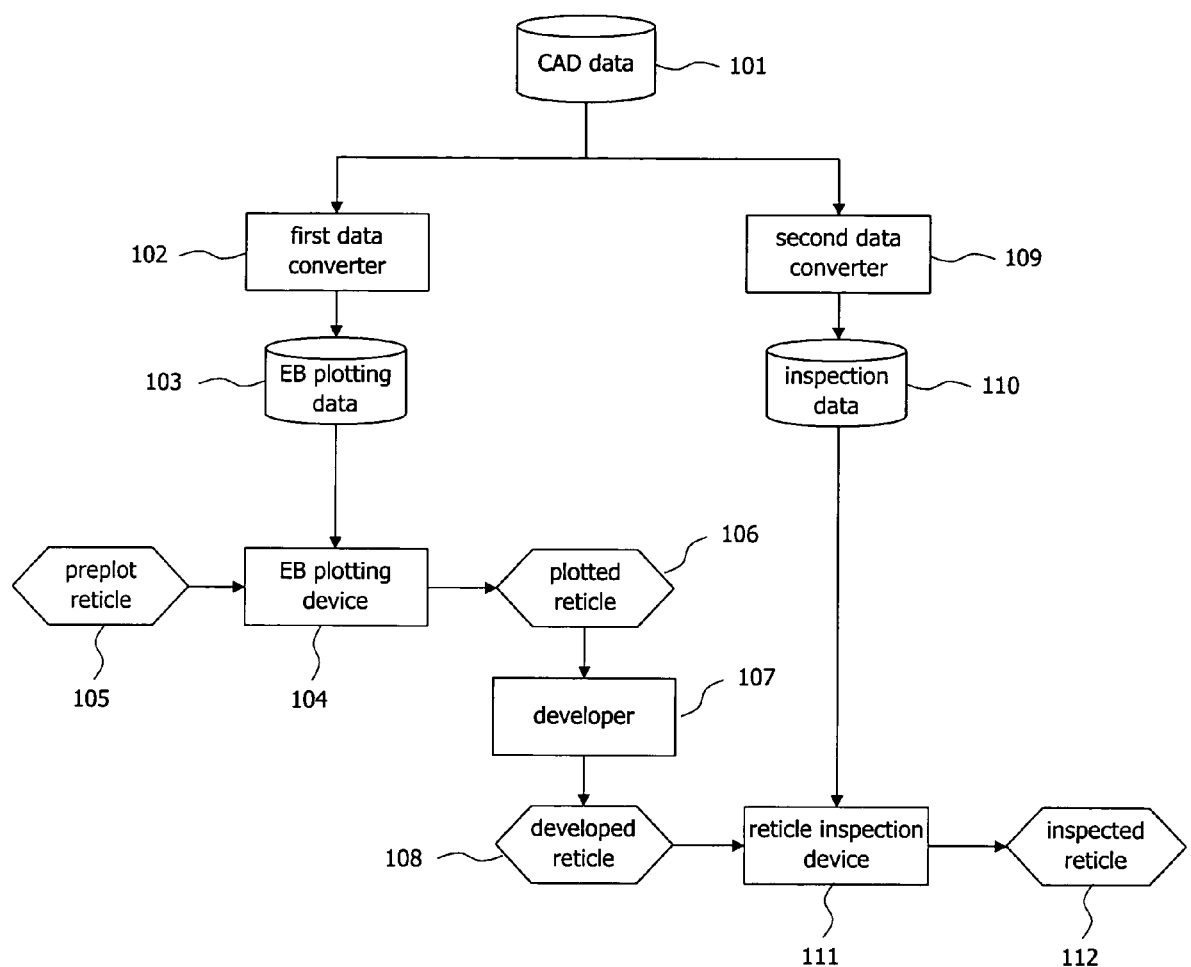
FIG. 1 is a schematic view for explaining an example of a reticle fabrication method of the prior art.
Figure 2:
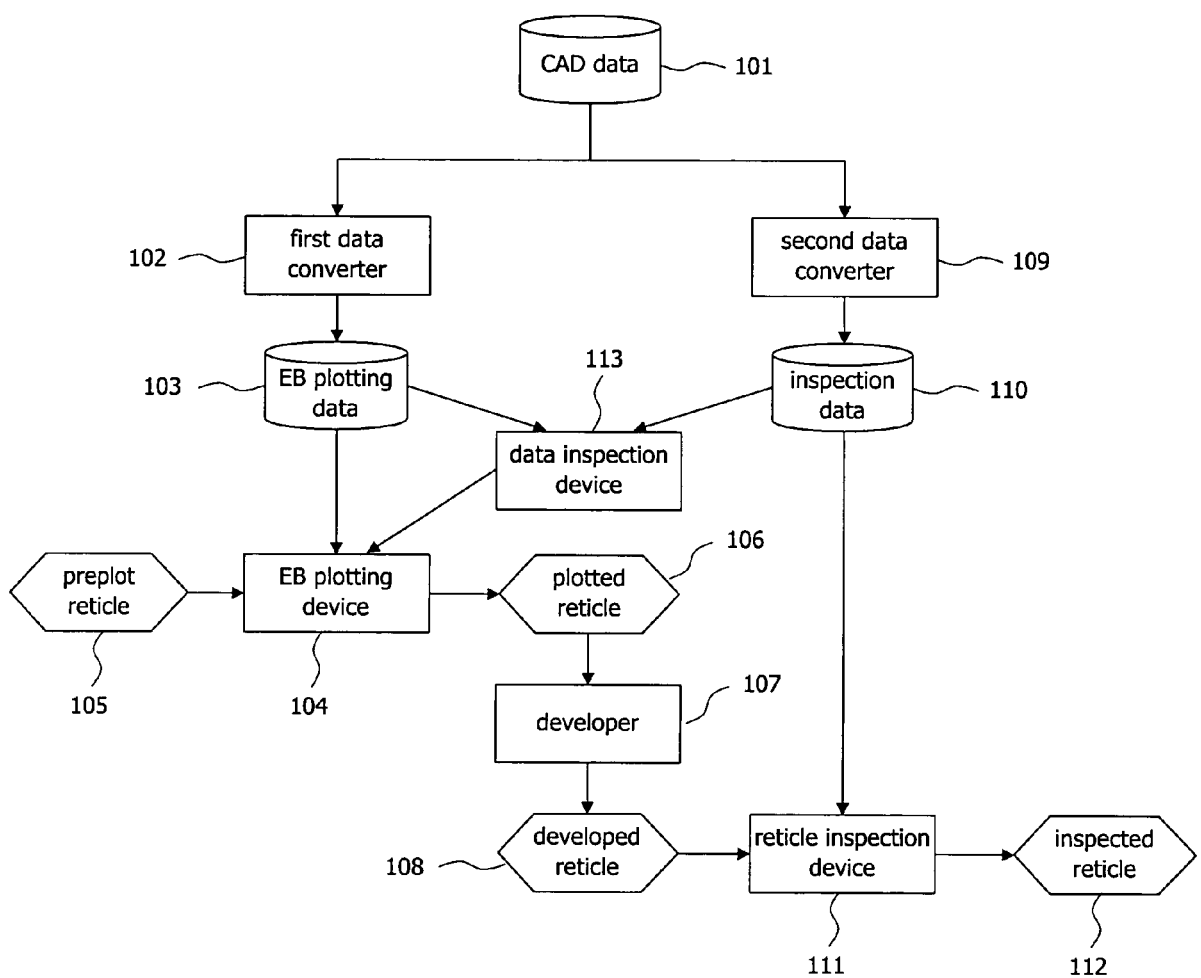
FIG. 2 is a schematic view for explaining another example of a reticle fabrication method of the prior art.
Figure 3:
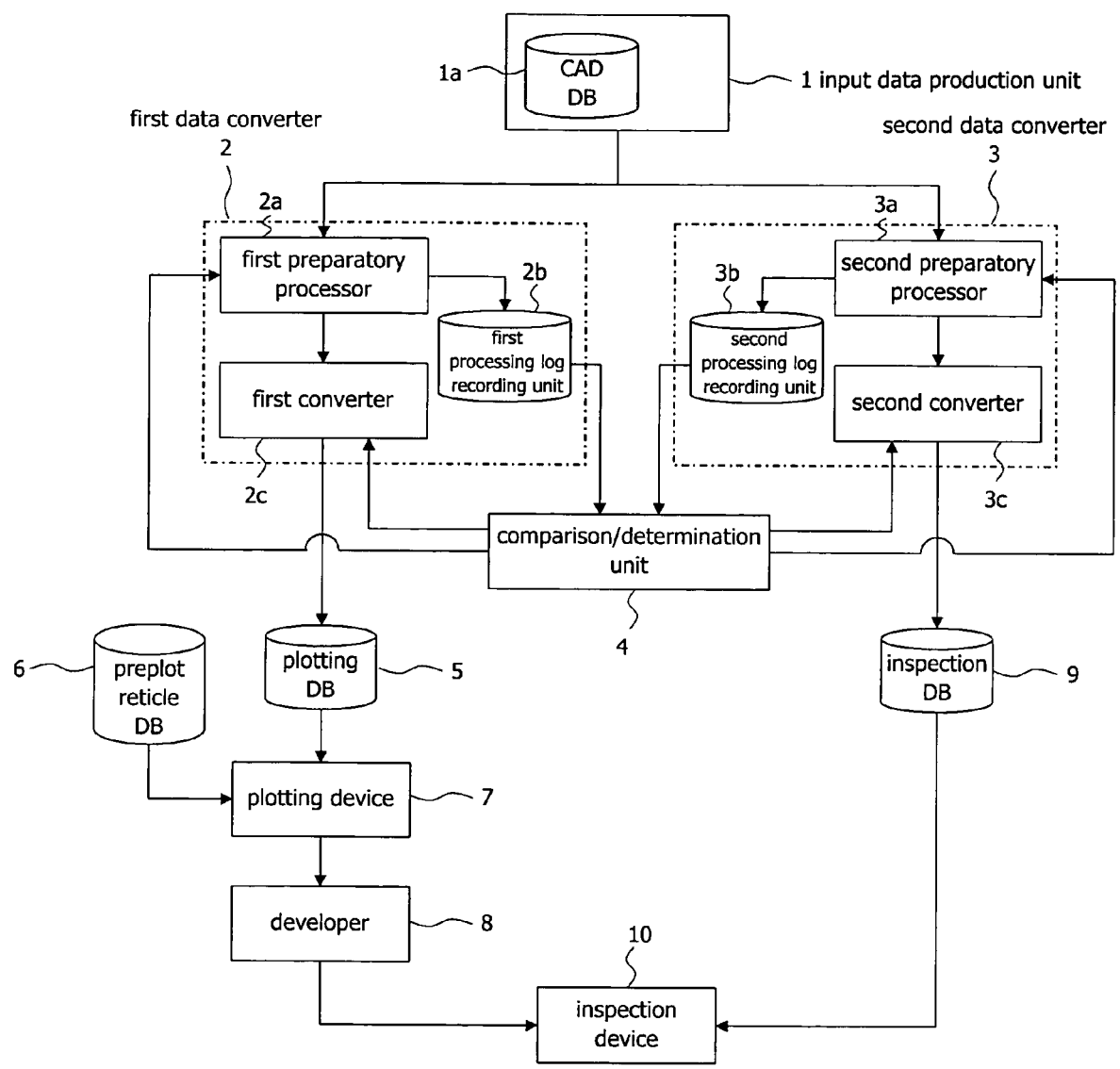
FIG. 3 is a block diagram showing the configuration of a reticle fabrication system according to the first embodiment of the present invention.

Referring to FIG. 3, the reticle fabrication system of the present embodiment comprises: input data production unit 1; first data converter 2, second data converter 3, comparison/determination unit 4, plotting database 5, preplot reticle database 6, plotting device 7, developer 8, inspection database 9, and inspection device 10.

Input data production unit 1 includes CAD database 1*a* for storing CAD data, which are reticle design data. Input data production unit 1 produces input data that are composed of CAD data, that have been recorded in this CAD database 1*a*, and design data, which are plotting data output instruction sentences or mask fabrication specification sentences that describe information for arranging the CAD data.

First data converter 2 converts CAD data to plotting data such as plotting patterns, and second data converter 3 converts CAD data to inspection data.

Plotting database 5 records therein the plotting data that have been converted in first data converter 2, and inspection database 9 records therein inspection data that have been converted in second data converter 3. In addition, preplot reticle database 6 records therein preplot reticles.

Based on the plotting data that have been recorded in plotting database 5, plotting device 7 plots figure patterns on the preplot reticles that have been recorded in preplot reticle database 6 and fabricates plotted reticles.

Developer 8 develops the plotted reticles that have been fabricated in plotting device 7 and produces developed reticles.

Inspection device 10 uses the inspection data that have been recorded in inspection database 9 to inspect the developed reticles that have been produced in developer 8.

First data converter 2 includes first preparatory processor 2*a*, first processing log recording unit 2*b*, and first converter 2*c*. First preparatory processor 2*a*, based on, for example, plotting data output instruction sentences that are included in the design data that have been produced in input data production unit 1, carries out preparatory processing such as conversion condition setting processing for implementing conversions such as rotation, enlargement, reduction, expansion, and contraction or for implementing format conversions upon the figure patterns that are included in the CAD data. First processing log recording unit 2*b* is a database for recording therein the log files in text format that indicate the content of the preparatory processing in first preparatory processor 2*a* as a first processing log. First converter 2*c* converts CAD data to plotting data after having obtained permission from comparison/determination unit 4, to be explained hereinbelow.

Second data converter 3 includes second preparatory processor 3a, second processing log recording unit 3b, and second converter 3c. Second preparatory processor 3a, based on, for example, plotting data output instruction sentences that are contained in design data that have been produced by input data production unit 1, carries out preparatory processing such as conversion condition setting processing for implementing conversions such as rotation, enlargement, reduction, expansion or contraction or for implementing format conversions upon the figure patterns that are contained in CAD data. Second conversion log recording unit 3b is a database for recording therein log files in text format that indicate the content of the preparatory processing in second preparatory processor 3a as a second processing log. Second converter 3c converts CAD data to inspection data after having obtained permission from comparison/determination unit 4, to be explained hereinbelow.

Comparison/determination unit 4 receives the first processing log from first processing log recording unit 2b of first data converter 2 and the second processing log from second processing log recording unit 3b of second data converter 3, and compares these logs to determine whether the data conversion preparatory processing has been carried out correctly in first data converter 2 and second data converter 3.

If the two processing results match, then comparison/determination unit 4 determines that preparatory processing has been carried out correctly and permits first converter 2c and second converter 3c the conversion processes. On the other hand, if the two processing results do not match, then comparison/determination unit 4 determines that the preparatory processing has not been carried out correctly and feeds back the comparison results to first preparatory processor 2a and/or second preparatory processor 3a to prompt the reconsideration of the preparatory processing.

The reticle fabrication method according to the reticle fabrication system that is shown in FIG. 3 will be described with reference to the flow chart of FIG. 4.

Figure 4:
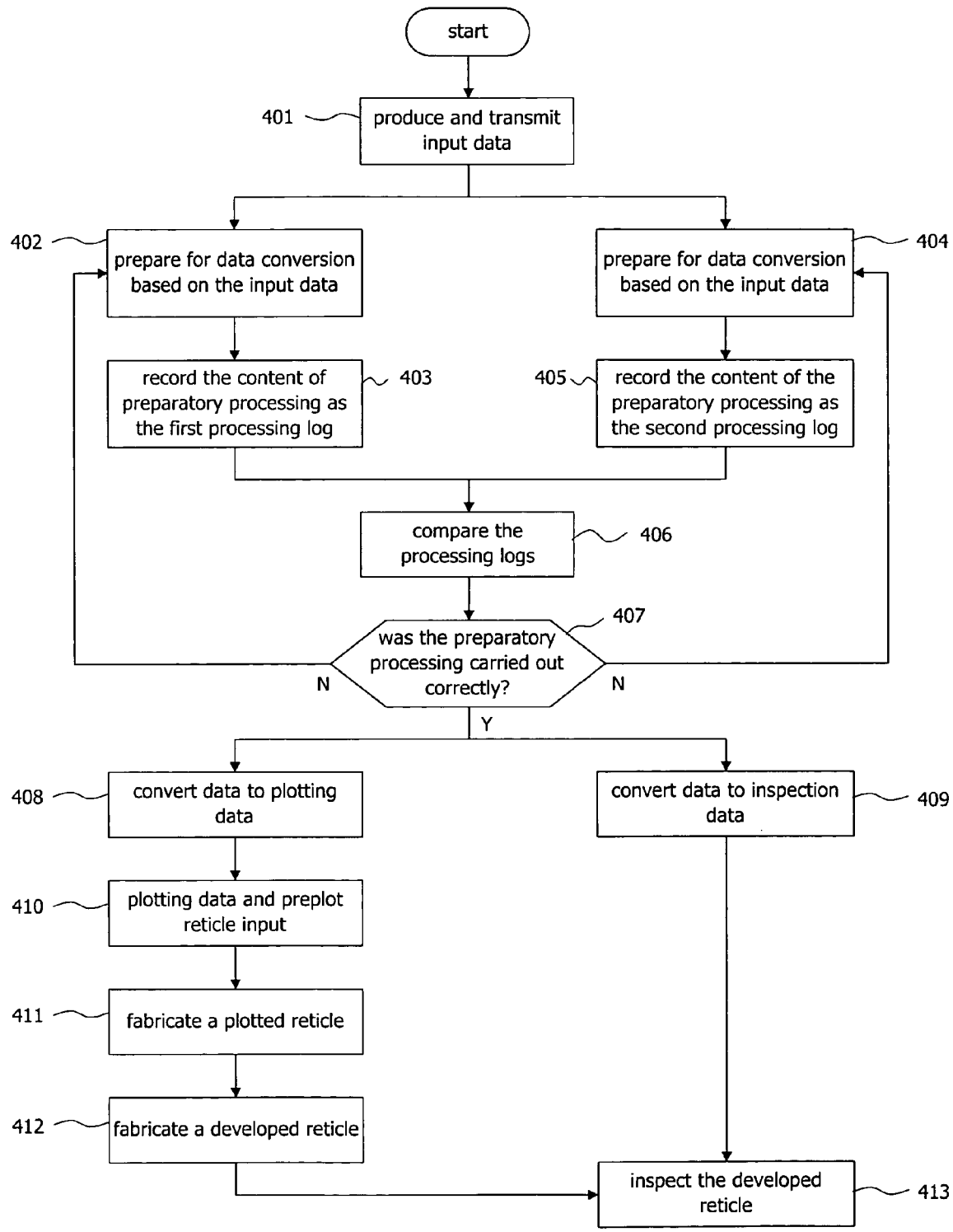
FIG. 4 is a flow chart for explaining the reticle fabrication method according to the reticle fabrication system that is shown in FIG. 3.

Referring to FIG. 4, in Step 401, input data production unit 1 produces input data that are composed of CAD data, which are reticle design data, and design data that are, for example, plotting data output instruction sentences that describe information for arranging CAD data, and transmits the input data produced to first data converter 2 and second data converter 3.

In Step 402, first preparatory processor 2a of first data converter 2, based on the input data from input data production unit 1, carries out preparatory processing such as conversion condition setting processing for implementing conversions such as rotation, enlargement, reduction, expansion, and contraction or for implementing format conversions upon the figure patterns that are contained in the CAD data. The content of this preparatory processing is recorded as first processing log in first processing log recording unit 2b in Step 403.

On the other hand, in Step 404, second preparatory processor 3a of second data converter 3 also carries out preparatory processing based on the input data from input data production unit 1. The content of the preparatory processing is recorded as second processing log in second processing log recording unit 3b.

In Step 406, comparison/determination unit 4 compares the first processing log that has been recorded in first processing log recording unit 2b with the second processing log that has been recorded in second processing log recording unit 3b, and in Step 407, comparison/determination unit 4 determines, based on the comparison results of the first and second processing logs, whether the preparatory processing of data conversion has been carried out correctly.

If the first and second processing logs do not match in Step 407, then comparison/determination unit 4 determines that the preparatory processing in first preparatory processor 2a and/or second preparatory processor 3a has not been carried out correctly. Then the control proceeds to Step 402 and/or Step 404 for prompting reconsideration of the preparatory processing.

On the other hand, if the first and second processing logs match in Step 407, then comparison/determination unit 4 determines that the preparatory processing in first preparatory processor 2a and second preparatory processor 3a has been carried out correctly and permits the actual conversion process.

Thereafter, first converter 2c converts the CAD data to plotting data in Step 408, and second converter 3c converts CAD data to inspection data in Step 409. The plotting data converted in Step 408 are recorded in plotting database 5, and the inspection data converted in Step 409 are recorded in inspection database 9.

Subsequently, in Step 410, plotting device 7 receives plotting data that have been recorded in plotting database 5 and a preplot reticle that has been recorded in preplot reticle database 6. The plotting data that are applied as input to plotting device 7 include plotting patterns that are the patterns for mask production and a plotting job that instructs how and on which positions these plotting patterns are to be plotted on the mask.

In Step 411, plotting device 7 next plots the circuit patterns that are designated by the CAD data, based on the plotting data, onto the preplot reticle and fabricates the plotted reticle. This plotted reticle is then supplied to developer 8.

Developer 8 next develops the plotted reticle to fabricate a developed reticle in Step 412. This developed reticle is then supplied as input to inspection device 10.

Finally, in Step 413, inspection device 10 uses the inspection data that have been recorded in inspection database 9 to carry out an inspection of the developed reticle.

Specifically, inspection device 10 reads the inspection data that have been recorded in inspection database 9 and then generates a reference image from the inspection data that have been read. Inspection device 10 generates an inspection object image from the information that has been obtained from the surface of the developed reticle, and then compares the generated inspection object image with the above-mentioned reference image that has been generated from the inspection data. Inspection device 10, based on this comparison, determines whether or not the figure patterns have been correctly formed on the developed reticle according to the information of the CAD data.

Second Embodiment

Figure 5:
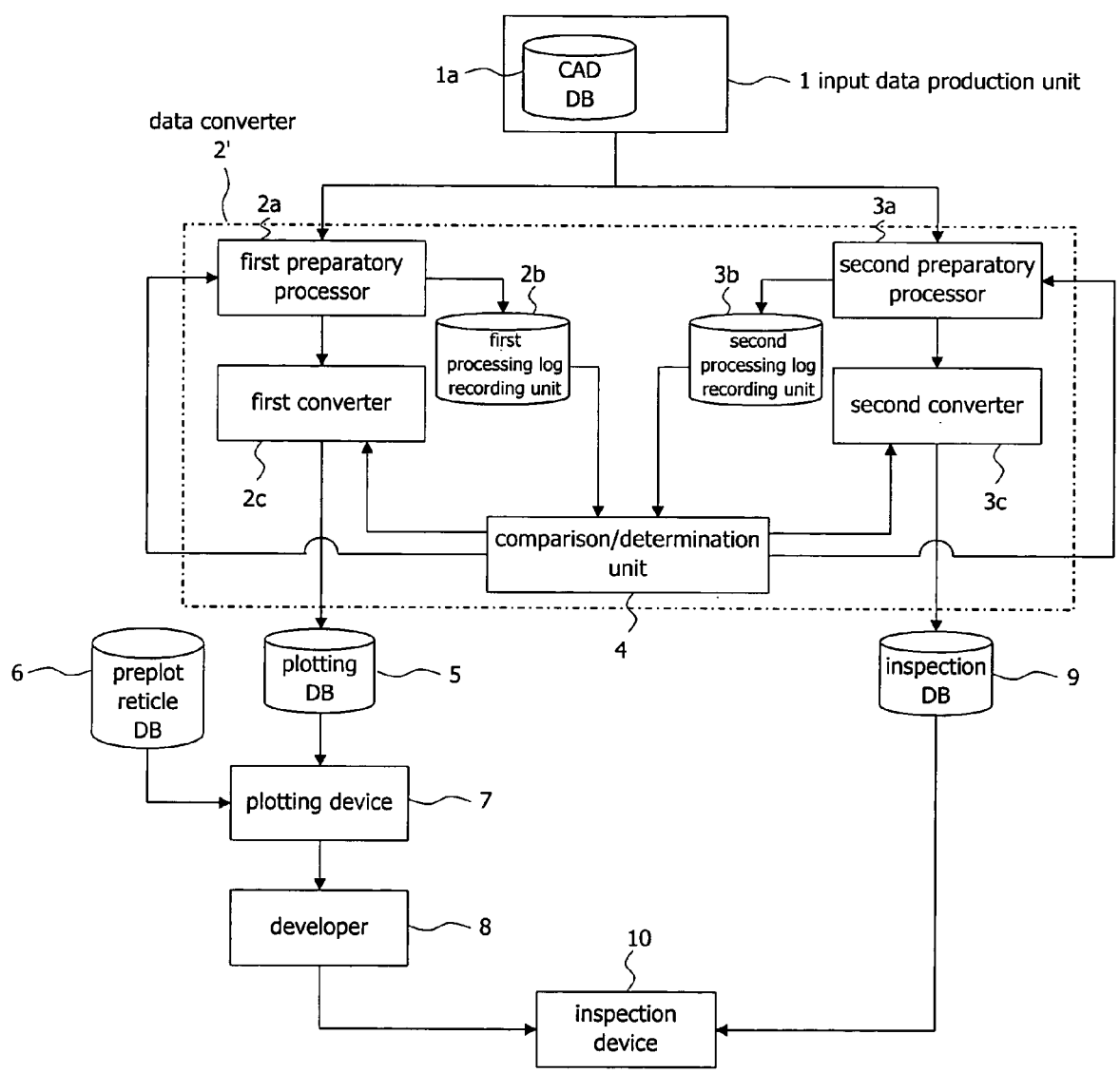
FIG. 5 is a block diagram showing the configuration of the reticle fabrication system according to the second embodiment of the present invention.

The configuration of the reticle fabrication system of the second embodiment of the present invention will be described with reference to FIG. 5. In FIG. 5, parts that are identical to parts in FIG. 3 are given the same reference numerals.

Referring to FIG. 5, the reticle fabrication system of the present embodiment differs from the first embodiment of FIG. 3 in that first data converter 2, second data converter 3, and comparison/determination unit 4 are combined into data converter 2'.

Namely, in the present embodiment, first preparatory processor 2a, first processing log recording unit 2b, first converter 2c, second preparatory processor 3a, second processing log recording unit 3b, second converter 3c, and comparison/determination unit 4 are all accommodated in one data converter 2'.

This integration of the system for converting plotting data and inspection data allows comparison/determination unit 4 to determine in a common system whether the preparatory process has been carried out correctly or not to be carried out. In addition, the system can be made more compact. Still further, if the determination results of the preparatory processing by comparison/determination unit 4 indicate that an error has occurred, control can automatically proceed to the preparatory processing for data conversion. Finally, because there is no need to supply input data prepared by input data production unit 1 to a plurality of devices, this embodiment is advantageous in that file redundancy is eliminated, the area required for saving data is reduced, and the time needed for data transmission is saved.

Processing that follows the determination by comparison/determination unit 4 that the preparatory processing of data conversion has been carried out correctly is carried out in the same in the first embodiment.

For example, although first preparatory processor 2a and first processing log recording unit 2b have been described as being provided in the same device as first converter 2c in the first and second embodiments, the present invention is not limited to this configuration. In other words, in the present invention, first preparatory processor 2a and first processing log recording unit 2b should be provided on the upstream side in processing from first converter 2c but need not be provided in the same device as first converter 2c, and therefore, may be provided in a different device from first converter 2c. Similarly, second preparatory processor 3a and second processing log recording unit 3b should be provided on the upstream side in processing from second converter 3c but need not be provided in the same device as second converter 3c, and therefore may be provided in a different device than second converter 3c.

In addition, in the first and second embodiments, the comparison results in comparison/determination unit 4 are fed back to first preparatory processor 2a and second preparatory processor 3a. However, these comparison results do not necessarily have to be fed back, and it is also possible to, for example, merely notify the operator by means of an alarm when an error has been determined.

Finally, although the data format of CAD data that are supplied as input from input data production unit 1 was presumed to differ from the data format of plotting device 7 in the first and second embodiments, the present invention is not limited to this form. In other words, the present invention can be applied in cases in which the data format of the CAD data is identical to the data format of plotting device 7. In such cases, following comparison and determination of the preparatory processing in comparison/determination unit 4, CAD data may be supplied without alteration to plotting device 7 without converting the CAD data to plotting data in first converter 2c.

The present invention is not limited to applications to reticles as masks that are used in photolithographic techniques that use short-wavelength light sources such as g-rays, i-rays, KrF and ArF as in the prior art. For example, the present invention can also be applied to masks that are used in photolithographic techniques that employ light sources with ultra-short wavelengths of the ultraviolet light region such as VUV and EUV, and in photolithographic techniques that employ light sources other than ultraviolet light such as X-rays and EB.

While preferred embodiments of the present invention have been described using specific terms, such description is for illustrative purposes only, and it is to be understood that changes and variations may be made without departing from the spirit or scope of the following claims.

What is claimed is:

1. A reticle fabrication system comprising:
    a first preparatory processing means for performing preparatory processing for converting CAD data, which are reticle design data, to plotting data;
    a second preparatory processing means for performing preparatory processing for converting said CAD data to inspection data;
    a first preparatory process recording means for recording therein a log file indicative of the content of preparatory processing of said first preparatory processing means as a first processing log;
    a second preparatory process recording means for recording therein a log file indicative of the content of preparatory processing of said second preparatory processing means as a second processing log;
    a comparison/determination means for comparing said first processing log that has been recorded in said first preparatory process recording means and said second processing log that has been recorded in said second preparatory process recording means, and for permitting conversion of said CAD data upon determining, based on results of this comparison, that said preparatory processing has been carried out correctly;
    a first conversion means for converting said CAD data to said plotting data when conversion of said CAD data has been permitted by said comparison/determination means;
    a second conversion means for converting said CAD data to said inspection data when conversion of said CAD data has been permitted by said comparison/determination means; and
    an inspection means for inspecting a reticle that has been produced from said plotting data that have been converted by said first conversion means, using said inspection data that have been converted by said second conversion means.

2. The reticle fabrication system according to claim 1, wherein said first processing log and said second processing log are log files in text format.

3. The reticle fabrication system according to claim 1, wherein said first preparatory processing means, said second preparatory processing means, said first preparatory process recording means, said second preparatory process recording means, said comparison/determination means, said first conversion means, and said second conversion means are all installed in a common data conversion device.

4. The reticle fabrication system according to claim 1, wherein said comparison/determination means is provided with a function to transmit said comparison results to said first preparatory processing means and/or said second preparatory processing means and to prompt a reconsideration of said preparatory processing when it has been determined that said preparatory processing has not been carried out correctly.

5. A reticle fabrication method, comprising
    (a) performing preparatory processing for converting CAD data, which are reticle design data, to plotting data;
    (b) performing preparatory processing for converting said CAD data;
    (c) recording a first processing log, which is a log file showing the content of preparatory processing for converting to said plotting data;
    (d) recording a second processing log, which is a log file showing the content of preparatory processing for converting to said inspection data;

(e) comparing said first processing log with said second processing log, and based on the comparison results, determining whether said preparatory processing has been carried out correctly;

(f) converting said CAD data to said plotting data and converting said CAD data to said inspection data, when it has been determined, based on comparison results of said first processing log and said second processing log, that said preparatory processing has been carried out correctly; and (g) inspecting a reticle that has been produced from said plotting data, using said inspection data.

6. A reticle fabrication method according to claim 5, wherein said step (c) and said operation (d) include recording said first processing log and said second processing log respectively as log files in text format.

7. A reticle fabrication method according to claim 5, further comprising:

(h) returning to said step (a) and/or said step (b) for prompting redoing said preparatory processing, when it has been determined, based on the results of comparing said first processing log and said second processing log, that said preparatory processing has not been carried out correctly.

8. The reticle fabrication system according to claim 1, wherein the preparatory processing comprises conversion condition setting processing for implementing conversions.

9. The reticle fabrication system according to claim 8, wherein the conversion comprises at least one of rotation, enlargement, reduction, expansion and contraction and the preparatory processing comprises conversion condition setting processing for implementing conversions.

10. A reticle fabrication method according to claim 5, wherein the preparatory processing comprises conversion condition setting processing for implementing conversions.

11. A reticle fabrication method according to claim 10, wherein the conversion comprises at least one of rotation, enlargement, reduction, expansion and contraction and the preparatory processing comprises conversion condition setting processing for implementing conversions.

12. A reticle fabrication system comprising:

a first preparatory processor which performs preparatory processing for converting CAD data, which are reticle design data, to plotting data;

a second preparatory processor which performs preparatory processing for converting said CAD data to inspection data;

a first processing log recording unit which records a log file indicative of the content of preparatory processing of said first preparatory processor as a first processing log;

a second processing log recording unit which records a log file indicative of the content of preparatory processing of said second preparatory processor as a second processing log;

a comparison/determination unit which compares said first processing log that has been recorded in said first processing log recording unit and said second processing log that has been recorded in said second processing log recording unit, and for permitting conversion of said CAD data upon determining, based on results of this comparison, that said preparatory processing has been carried out correctly;

a first converter which converts said CAD data to said plotting data when conversion of said CAD data has been permitted by said comparison/determination unit;

a second converter which converts said CAD data to said inspection data when conversion of said CAD data has been permitted by said comparison/determination unit; and an inspection device which inspects a reticle that has been produced from said plotting data that have been converted by said first converter, using said inspection data that have been converted by said second converter.

13. The reticle fabrication system according to claim 12, wherein said first processing log and said second processing log are log files in text format.

* * * * *

UNITED STATES PATENT AND TRADEMARK OFFICE
CERTIFICATE OF CORRECTION

PATENT NO. : 7,577,287 B2  Page 1 of 1
APPLICATION NO. : 11/205095
DATED : August 18, 2009
INVENTOR(S) : Yasuko Saito It is certified that error appears in the above-identified patent and that said Letters Patent is hereby corrected as shown below:

Column 8, line 57, after "comprising" insert --:--

Column 9, line 14, delete "step" and insert --operation--

Column 9, line 19, delete both occurrences of "step" and insert --operation--

Signed and Sealed this

Second Day of February, 2010

David J. Kappos
*Director of the United States Patent and Trademark Office*